(12) United States Patent
Timopheev et al.

(10) Patent No.: US 11,946,985 B2
(45) Date of Patent: Apr. 2, 2024

(54) ELECTRONIC CIRCUIT FOR MEASURING AN ANGLE AND AN INTENSITY OF AN EXTERNAL MAGNETIC FIELD

(71) Applicant: Allegro MicroSystems, LLC, Manchester, NH (US)

(72) Inventors: Andrey Timopheev, Vif (FR); Ali Alaoui, Polienas (FR); Evgeny Burmistrov, San Jose, CA (US)

(73) Assignee: Allegro MicroSystems, LLC, Manchester, NH (US)

( * ) Notice: Subject to any disclaimer, the term of this patent is extended or adjusted under 35 U.S.C. 154(b) by 285 days.

(21) Appl. No.: 17/440,908

(22) PCT Filed: Mar. 19, 2020

(86) PCT No.: PCT/IB2020/052517
§ 371 (c)(1),
(2) Date: Sep. 20, 2021

(87) PCT Pub. No.: WO2020/188513
PCT Pub. Date: Sep. 24, 2020

(65) Prior Publication Data
US 2022/0163605 A1    May 26, 2022

(30) Foreign Application Priority Data
Mar. 21, 2019   (EP) .................................... 19315017

(51) Int. Cl.
*G01R 33/00* (2006.01)
*G01D 5/14* (2006.01)
*G01R 33/06* (2006.01)

(52) U.S. Cl.
CPC ........... *G01R 33/0029* (2013.01); *G01D 5/14* (2013.01); *G01R 33/06* (2013.01)

(58) Field of Classification Search
CPC ........................... G01R 33/0029; G01R 33/06
(Continued)

(56) References Cited

U.S. PATENT DOCUMENTS

| 5,880,586 A | 3/1999 | Dukart et al. |
| 11,307,017 B2 * | 4/2022 | Romero .................. G01B 7/30 |

(Continued)

FOREIGN PATENT DOCUMENTS

| EP | 1918678 A2 | 5/2008 |
| EP | 2682773 A1 | 1/2014 |

(Continued)

OTHER PUBLICATIONS

International Search Report for PCT/IB2020/052517 dated Jun. 9, 2020.
(Continued)

*Primary Examiner* — John H Le
(74) *Attorney, Agent, or Firm* — Daly, Crowley, Mofford & Durkee, LLP

(57) ABSTRACT

An electronic circuit for measuring an angle and an intensity of an external magnetic field, includes: first and second magnetic field sensing units having sensing axes substantially orthogonal to each other; a voltage generator supplying a synchronization signal, a first voltage waveform to the first magnetic field sensing unit and a second voltage waveform to the second magnetic field sensing unit; a signal conditioning unit configured for adding the first and second sensing output signals and outputting a conditioned signal. The first and second voltage waveforms have substantially the same amplitude and frequency and are phase shifted by about 90° with respect to each other. The conditioned signal and the synchronization signal are inputted into a magnetic field angle detection unit configured for measuring a phase shift between the conditioned signal and the synchronization
(Continued)

signal and for determining the angle of the external magnetic field from the measured phase shift.

14 Claims, 7 Drawing Sheets

(58) Field of Classification Search
USPC .......................................................... 702/57
See application file for complete search history.

(56) References Cited

U.S. PATENT DOCUMENTS

2019/0383886 A1* 12/2019 Shoemaker ........ G01R 33/0047
2020/0080867 A1*  3/2020 Foletto ..................... G01D 5/16

FOREIGN PATENT DOCUMENTS

| EP | 3122070 A1 | 1/2017 |
| EP | 3171615 A1 | 5/2017 |

OTHER PUBLICATIONS

Written Opinion for PCT/IB2020/052517 dated Jun. 9, 2020.
Lenz, J., et al.: "Magnetic sensors and their applications", IEEE Sensors Journal, Jun. 2006, pp. 631-649, vol. 6, No. 3, XP055417848.

* cited by examiner

ELECTRONIC CIRCUIT FOR MEASURING AN ANGLE AND AN INTENSITY OF AN EXTERNAL MAGNETIC FIELD

FIELD

The present disclosure concerns an electronic circuit for measuring an angle and an intensity of an external magnetic field and more particularly, to an electronic circuit that can determine the magnetic field angle directly from an analog signal.

DESCRIPTION OF RELATED ART

FIG. 1 shows a conventional 2D magnetic sensor for measuring an orientation angle of an external magnetic field 60. Such a 2D magnetic sensor can be formed by combining two 1D magnetic sensors 130, 131, wherein each 1D magnetic sensor 130, 131 can be formed from four magnetic sensor elements arranged (not shown) in a full (Wheatstone)-bridge circuit configuration. One of the 1D magnetic sensor 130 has a sensing axis 136 being orthogonal to the sensing axis 137 of the other 1D magnetic sensor 131. A constant DC voltage (V) can be supplied to the two 1D magnetic sensors 130, 131. Each 1D magnetic sensor 130, 131 generates a first output 132 and a second output 133. The first and second output signals 132, 133 of each of the 1D magnetic sensors 130, 131 are supplied to the input terminals of a respective differential amplifier 650. Each differential amplifier 650 outputs a differential amplifier output signal 651 that is supplied to an analog-to-digital converter 134 in order to obtain two digitized signals 138. The two digitized signals 138 are inputted into a processing unit 139 where software routine solves the arctangent of the ratio of the two digitized signals 138 to extract the external magnetic field angle.

EP1918678 discloses a displacement sensor using GMR elements for detecting a displacement of a physical quantity such as angle is to be provided wherein a waveform distortion of output voltage is diminished. There are installed at least two Wheatstone bridge circuits having a predetermined angular offset and each comprising a plurality of GMR elements, the GMR elements each having a fixed magnetic layer set to a predetermined magnetization direction. An AC power supply is used as a power supply of the Wheatstone bridge circuits and a displacement of a physical quantity such as a rotational angle is detected on the basis of AC-modulated outputs from the Wheatstone bridge circuits. An anisotropic self-bias effect of a free magnetic layer in each GMR element can be diminished and hence it is possible to remedy a waveform distortion of an output signal based on the anisotropic self-bias effect of the free magnetic layer.

U.S. Pat. No. 5,880,586 discloses an apparatus for determining rotational position of a rotatable element without contacting it, which includes a sensor device having two Hall or AMR sensor elements for sensing a magnetic field of magnetic field strength (B) generated by or influenced by the rotational position of the rotatable element and for producing output signals according to the magnetic field and thus the rotational position of the rotatable element. In order to easily detect the absolute rotational position of the rotatable element, the sensor device is constructed and positioned with respect to the rotatable element so that in every rotational position the field lines from the rotatable element extend at right angles to the sensor structures defined by the direction of an alternating current in the sensor elements. Using different embodiments of an electronic evaluation circuit, the direction components of the magnetic field are evaluated to determine the rotational position by comparing the input current to one of the sensors and the sum of the output signals of the respective sensor elements. Either sinusoidal or rectangular alternating voltages or direct voltages are input to the sensor elements.

EP2682773 discloses a single-package bridge-type magnetic-field angle sensor comprising one or more pairs of magnetic tunnel junction sensor chips rotated relative to each other by 90 degrees in order to detect two magnetic field components in orthogonal directions respectively is disclosed. The magnetic-field angle sensor may comprise a pair of MTJ full-bridges or half-bridges interconnected with a semiconductor package lead. The magnetic-field angle sensor can be packaged into various low-cost standard semiconductor packages.

A disadvantage of the conventional 2D magnetic sensor is that it must perform cumbersome and lengthy mathematical operations which require a powerful processing unit 139.

SUMMARY

According to the invention, an electronic circuit for measuring an angle and a field intensity of an external magnetic field, comprises:
- a first magnetic field sensing unit outputting a first sensing output signal and a second magnetic field sensing unit outputting a second sensing output signal, a first sensing axis of the first magnetic field sensing unit being substantially orthogonal to a second sensing axis of the second magnetic field sensing unit;
- a periodic voltage generator supplying a synchronization signal having a generator frequency, the periodic voltage generator further supplying a first voltage waveform to the first magnetic field sensing unit and a second voltage waveform to the second magnetic field sensing unit;
- a signal conditioning unit configured for adding the first sensing output signal to the second sensing output signal and outputting a conditioned signal;
- wherein the first and second voltage waveforms have substantially the same amplitude and the same generator frequency, and are phase shifted by about 90° with respect to each other; and wherein the conditioned signal and the synchronization signal are inputted into a magnetic field angle detection unit, the magnetic field angle detection unit being configured for measuring a phase shift between the conditioned signal and the synchronization signal and for determining the angle of the external magnetic field from said measured phase shift.

The electronic circuit according to the invention uses the principle of quadrature amplitude modulation (QAM). The angle of the external magnetic field can be determined directly from the analog conditioned signal.

The first voltage waveform Q(t) and the second voltage waveform I(t) can be represented, respectively by equations (1) and (2):

$$(t) = A_1 \sin(\theta(t)) \tag{1}$$

$$I(t) = A_2 \cos(\theta(t)) \tag{2},$$

where θ is the angle of the external magnetic field, $A_1$ is the amplitude of the first magnetic field sensing unit and $A_2$ is the amplitude of the second magnetic field sensing unit. The amplitudes $A_1$, $A_2$ of the first and second sensing output signal are modulated by the external magnetic field angle and intensity.

By combining the two quadrature signals, i.e., the first and second voltage waveforms, each having a defined amplitude, one obtains a new periodic signal (conditioned signal) which phase is defined by arctangent of the amplitudes ratio of initial first and second voltage waveforms.

The conditioned signal can correspond to a monoharmonic signal having a phase and an amplitude. Both amplitude and phase of the monoharmonic conditioned signal carry the information of the angle and field intensity of the external magnetic field. The phase shift of the conditioned signal relative to the first and second voltage waveform contains information about the angle of the external magnetic field.

If the amplitudes $A_1$, $A_2$ are equal, the phase in the conditioned signal is equal to the magnetic field angle $\phi(t)$ given by equation (3):

$$\phi(t)=\tan^{-1}(Q(t)/I(t))=\theta(t) \quad (3).$$

The amplitude $A_c$ of the conditioned signal is then equal to:

$$A_c=\sqrt{A_1^2+A_2^2} \quad (4).$$

which is independent on the angle of the external magnetic field. Thus, if the first and second magnetic field sensing units work in the linear regime, the amplitude $A_c$ of the conditioned signal can be used as a measure of external magnetic field intensity. Otherwise a linearization procedure can be applied to recover magnetic field amplitude.

In an embodiment, the first voltage waveform comprises a sine wave and the second voltage waveform comprises a cosine wave.

The first and second sensing output signals are substantially in-phase with the first and second voltage waveforms, and the amplitude of the first and second sensing output signal is proportional to the cosine of the angle between the first and second sensing axis and to the angle of the external magnetic field.

The signal conditioning unit can be configured for adding the first sensing output signal to the second sensing output signal in the ratio 1:1 or with different ratio which considers possible difference in sensitivity between two sensing units. The signal conditioning unit can also admix a certain part of the input signal driving sensing unit to its output to cancel possible electrical offset stemming from electrical misbalance of four sensing elements comprising a Wheatstone full bridge—i.e. a sensing unit. The signal conditioning unit can also apply a correction to the summed signal in case of non-orthogonal configuration of sensing axes of two sensing units. Finally, the signal conditioning unit can apply filtering to the summed signal to filter out higher order harmonics from the signal and to improve thereby the accuracy of the electronic circuit.

In an embodiment, the first magnetic field sensing unit and second magnetic field sensing unit are configured such that an amplitude of the first and second sensing output signals varies linearly with a variation of the external magnetic field intensity. The electronic circuit can then comprise a magnetic field intensity detection unit configured for determining the field intensity of the external magnetic field. For fixed amplitude of magnetic field, each sensing unit gives an output differential voltage which is proportional to cosine of the angle between external magnetic field direction and sensing axis direction of a sensing unit.

The electronic circuit according to the invention does not require lengthy mathematical operations and a powerful processing unit. The angle and field intensity of the external magnetic field can be determined directly from the analog conditioned signal.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
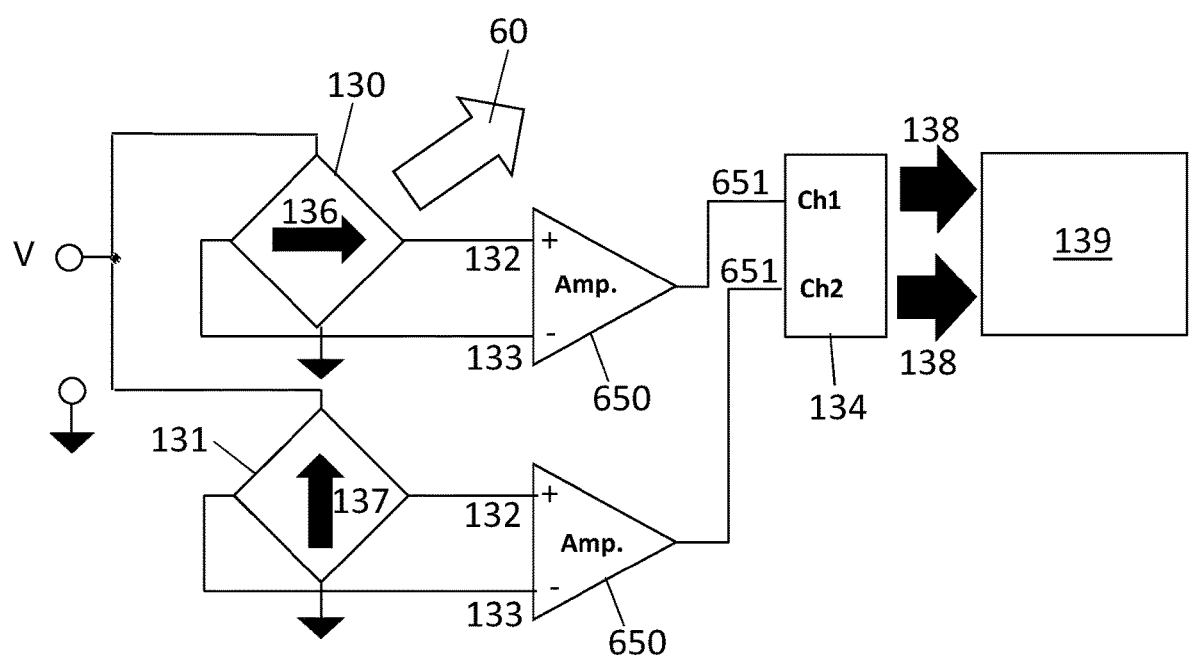
FIG. 1 shows a conventional sensor for measuring an orientation angle of an external magnetic field.
Figure 2:
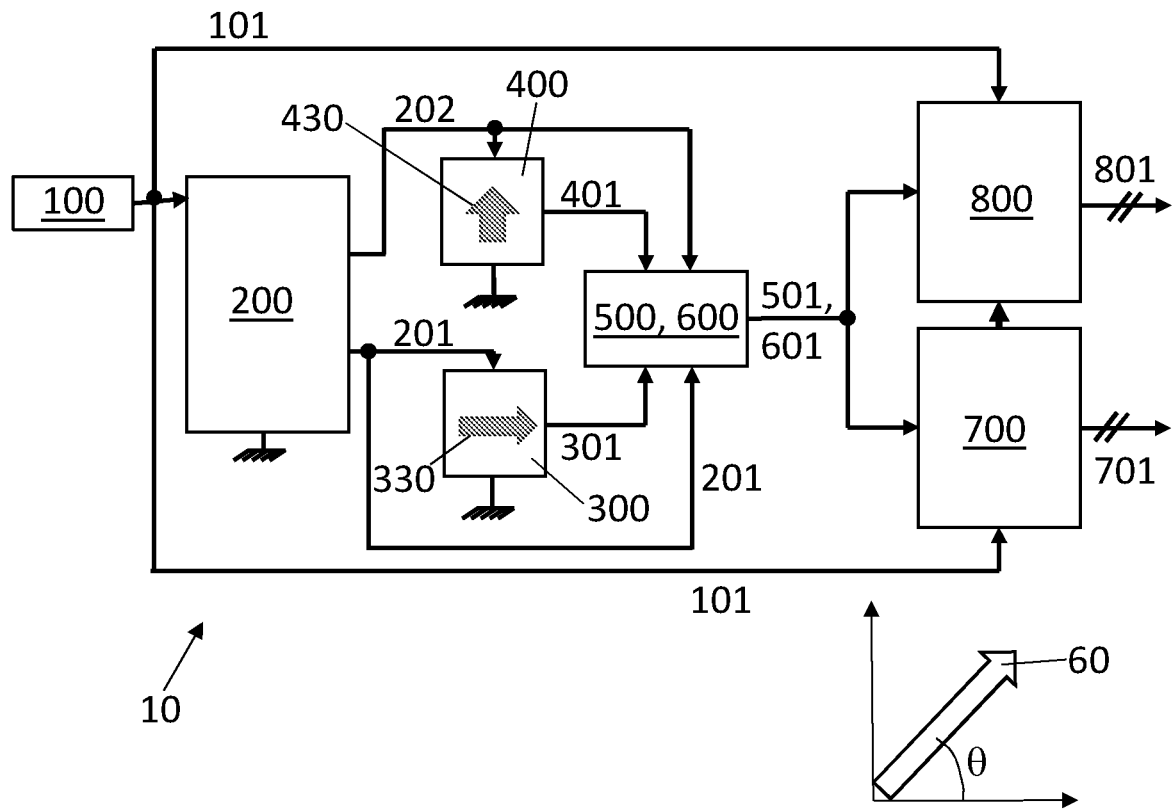
FIG. 2 shows an electronic circuit for measuring an angle and an intensity of an external magnetic field, according to an embodiment.

An electronic circuit 10 for measuring an angle $\theta$ and an intensity H of an external magnetic field 60 is shown in FIG. 2, according to an embodiment. The circuit comprises a voltage generator 200 configured for supplying a first generator signal 201 and a second generator signal 202. Each of the first and second generator signals 201, 202 has a periodic voltage waveform of fixed generator frequency $f_g$ and amplitude. A phase shift between the first generator signal 201 and the second generator signal 202 is of substantially 90°. The voltage generator 200 can further be configured for supplying a synchronization signal 101 having the generator frequency $f_g$. Alternatively, the electronic circuit 10 can further comprise a clock generator 100 generating the clock synchronization signal 101. The synchronization signal 101 synchronizes the operation of the voltage generator 200.

The electronic circuit 10 further comprises a first magnetic field sensing unit 300 outputting a first sensing output signal 301 and a second magnetic field sensing unit 400 outputting a second sensing output signal 401. The first magnetic field sensing unit 300 has a sensing axis 330 that is substantially orthogonal to a sensing axis 430 of the second magnetic field sensing unit 400.

The first generator signal 201 is supplied to an input of the first magnetic field sensing unit 300 and the second generator signal 202 is supplied to an input of the second magnetic field sensing unit 400. The first magnetic field sensing unit 300 outputs a first sensing output signal 301 and the second magnetic field sensing unit 400 outputs a second sensing output signal 401. The amplitude of the first and second sensing output signals 301, 401 is changed relative to the amplitude of the first and second generator signals 201, 202, depending on the orientation of the external magnetic field 60, i.e., relative to the angle $\theta$ of the external magnetic field 60 and its intensity when the sensor is operating in the linear range.

The electronic circuit 10 further comprises a signal conditioning unit 500, 600 into which the first and second sensing output signals 301, 401 are inputted. The signal conditioning unit 500, 600 is configured for adding (or summing) the first sensing output signal 301 to the second output signal 401 and outputting a conditioned signal 601. The conditioned signal 601 can correspond to a monoharmonic signal having the generator frequency $f_g$.

The first generator signal 201 and the second generator signal 202 can also be inputted into the signal conditioning unit 500, 600 in order to compensate possible Wheatstone bridge electrical misbalance in modules 300, 400, to compensate possible misorthogonality between sensing axes 330 and 430 and to filter higher order harmonics from the summed signal.

The electronic circuit 10 further comprises a magnetic field angle detection unit 700. The conditioned signal 601 and the clock synchronization signal 101 are supplied to an input of the magnetic field angle detection unit 700. The synchronization signal 101 thus further synchronizes the operation of the magnetic field angle detection unit 700. The magnetic field angle detection unit 700 is configured for measuring a phase shift between the conditioned signal 601 and the synchronization signal 101. The magnetic field angle detection unit 700 is further configured for determining the angle θ of the external magnetic field 60 from the measured phase shift. The magnetic field angle detection unit 700 outputs a digital angle output 701 comprising the information about the determined angle θ.

The first magnetic field sensing unit 300 and second magnetic field sensing unit 400 are configured such that an amplitude of the first and second sensing output signals varies linearly with a variation of the external magnetic field intensity H. In that case, the electronic circuit can comprise a magnetic field intensity detection unit 800 configured for determining the external field intensity. The magnetic field intensity detection unit 800 can be configured for measuring an amplitude of the conditioned signal 601, supplied to an input of the magnetic field intensity detection unit 800, and determining the external field intensity H from the conditioned signal 601. The magnetic field intensity detection unit 800 outputs a digital magnetic field intensity output 801 comprising the information about the determined external field intensity H. The synchronization signal 101 further synchronizes the operation of the magnetic field intensity detection unit 800.

Each of the first magnetic field sensing unit 300 and second magnetic field sensing unit 400 can comprise a plurality of magnetic field sensing elements (20-23). Preferably, the magnetic field sensing elements are arranged in half-bridge or full (Wheatstone)-bridge circuit. In such configuration, the first and second magnetic field sensing units 300, 400 can act as a voltage divider, where the divider ratio is a function of intensity H and angle θ of the external magnetic field 60.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc.

Figure 3:
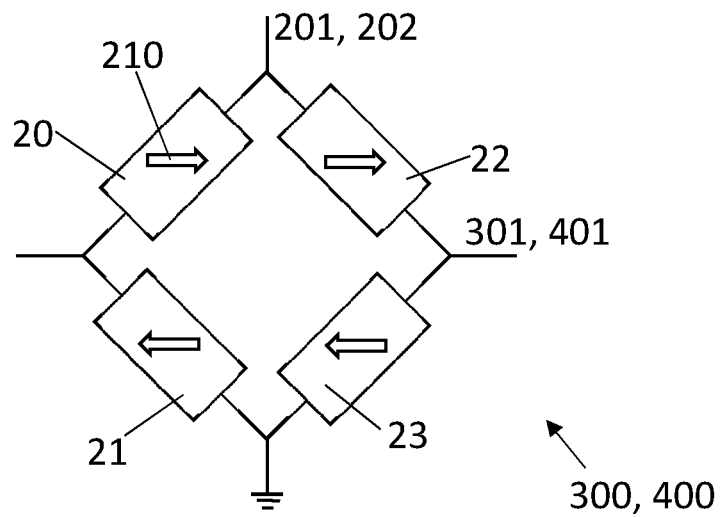
FIGS. 3 to 13 show the electronic circuit, according to other embodiments.

In a possible configuration illustrated in FIG. 3, the plurality of magnetic field sensing elements can comprise four magnetic field sensing elements arranged in a full-bridge circuit, comprising two magnetic field sensing elements 20, 21 connected in series in parallel to two other magnetic field sensing elements 22, 23 connected in series.

For example, the magnetic field sensing element 20-23 can comprise a MTJ, such as a self-referenced MTJ, comprising a reference layer having a reference magnetization 210 and a sense layer having a sense magnetization (not represented in FIG. 3) that can be oriented relative to the (pinned) reference magnetization 210, according to the orientation of the external magnetic field 60. A sensing axis 230 of the magnetic field sensing unit 300, 400 coincides with the direction of the reference magnetization 210. The sensing axis 330 of the first magnetic field sensing unit 300 substantially orthogonal to the sensing axis 430 of the second magnetic field sensing unit 400 can be obtained by programming the (pinning) direction of the reference magnetization 210.

In a possible variant, the signal conditioning unit 500, 600 can be configured for filtering out higher order harmonics from the conditioned signal 601. The signal conditioning unit 500, 600 can be further configured for performing amplitude and offset correction of the first and second sensing output signals 301, 401.

In another variant, the magnetic field angle detection unit 700 is configured for using linear mathematical operations in order to determine the magnetic field angle θ. The magnetic field angle detection unit 700 can be further configured for determining the angle θ of the external magnetic field 60 from the measured phase shift, and outputting the corresponding digital angle output 701.

In yet another variant, the magnetic field intensity detection unit 800 is configured for digitizing and linearizing the magnetic field strength value H when generating the digital magnetic field intensity output 801.

Figure 4:
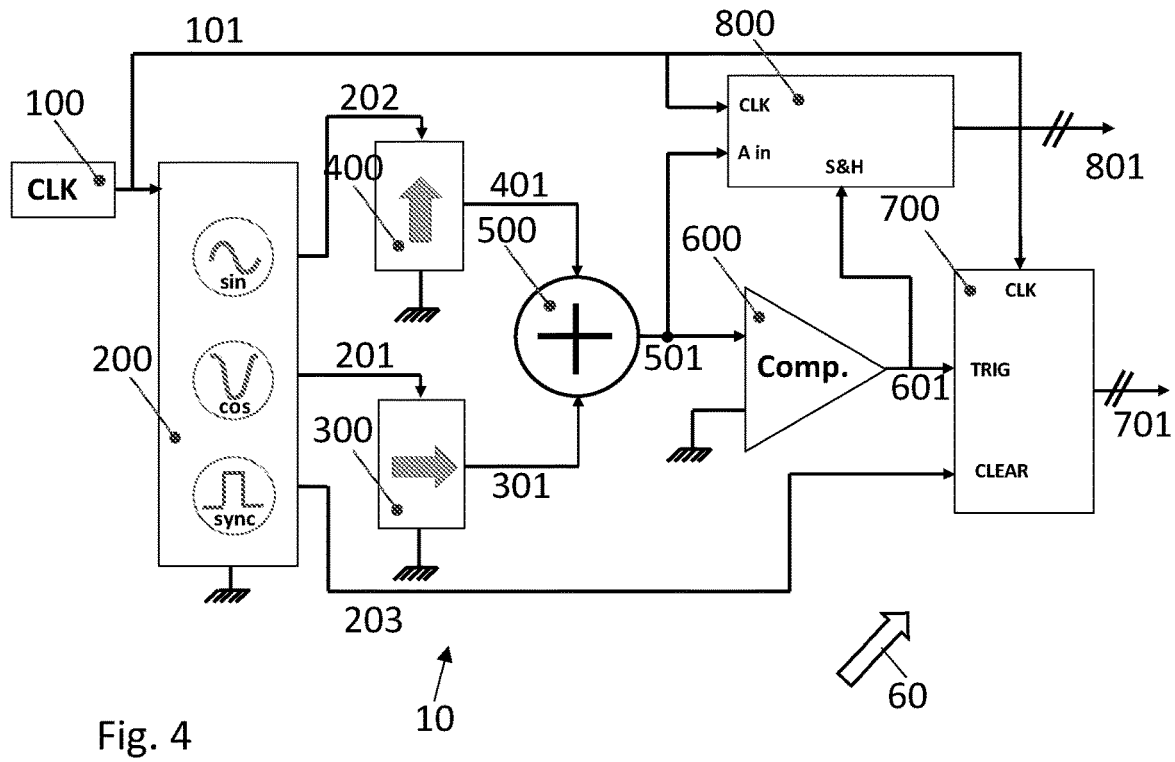

FIG. 4 shows the electronic circuit 10, according to an embodiment. Here, the voltage generator 200 is configured for supplying the first and second voltage waveforms 201, 202 having the same generator frequency $f_g$. The first and second voltage waveforms 201, 202 can comprise quadrature signals. For instance, the first voltage waveform 201 comprises a sine waveform and the second voltage waveform 202 comprises a cosine waveform. The voltage generator 200 can be further configured for supplying a generator synchronization signal 203 having the generator frequency $f_g$, thus the same frequency as the one of the first and a second generator signals 201, 202.

In the configuration of FIG. 4, the signal conditioning unit comprises an adder circuit 500 into which the first and second sensing output signals 301, 401 are inputted. The adder circuit 500 is configured for adding up the first and second sensing output signals 301, 401 and outputting a corresponding summed signal 501. The adder circuit 500 can be configured for adding the first sensing output signal to the second sensing output signal in the ratio 1:1

The signal conditioning unit comprises a phase comparator 600 into which the summed signal 501 is inputted. The phase comparator 600 is configured for detecting the phase of the summed signal 501 and output a digital phase comparator signal 601 that is inputted in the magnetic field angle detection unit 700. The phase comparator signal 601 may be a pulse width modulated signal wherein the duty period varies in proportion to the determined phase difference.

The magnetic field angle detection unit 700 can function as a counter that starts counting the pulses of the synchronization signal 101 coming from the clock generator 100 when comparator output 601 changes its state. The magnetic field angle detection unit 700 can stop counting the pulses of the synchronization signal 101 when the generator synchronization signal 203 arrives from the voltage generator 200. The number of counted pulses is proportional to the phase shift of the summed signal 501.

In the configuration of FIG. 4, the summed signal 501 and the phase comparator signal 601 are further inputted in the magnetic field intensity detection unit 800. The magnetic field intensity detection unit 800 can be configured for sampling the amplitude of the summed signal 501 at its maximum and obtaining a corresponding sampled magnetic field intensity output 801. This is performed thanks to synchronization with the phase of the summed signal 501 and predefined delay which is set by the number of clock pulses and which corresponds to 90° phase shift with respect to the phase comparator signal 601. The sampled magnetic field intensity output 801 can be digitized and linearized.

FIGS. 5 to 10 show the electronic circuit 10 according to other embodiments, wherein the magnetic field sensing units 300, 400 comprise magnetic field sensing elements having the reference magnetization 210 in the saturated state. In such configuration, the electronic circuit 10 does not require the magnetic field intensity detection unit 800.

Figure 5:
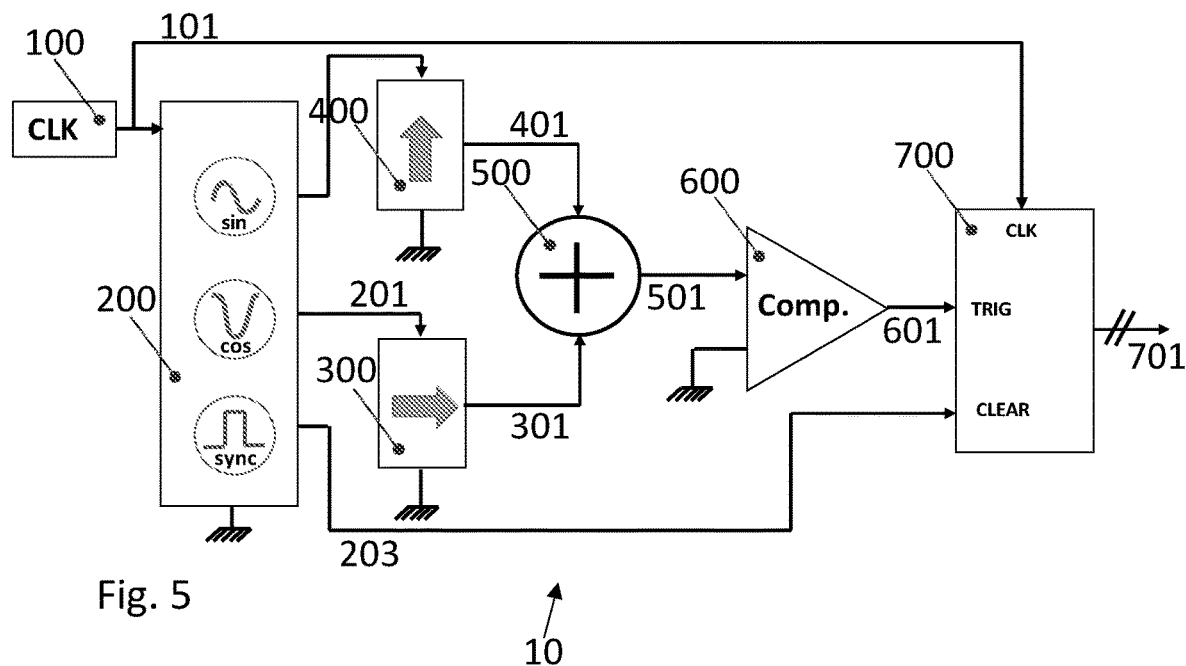

In the embodiment of FIG. 5, the electronic circuit 10 corresponds to the one of FIG. 4 without the magnetic field intensity detection unit 800. The summed signal 501 is inputted only in the phase comparator 600 and the phase comparator signal 601 is inputted only in the magnetic field angle detection unit 700.

Figure 6:
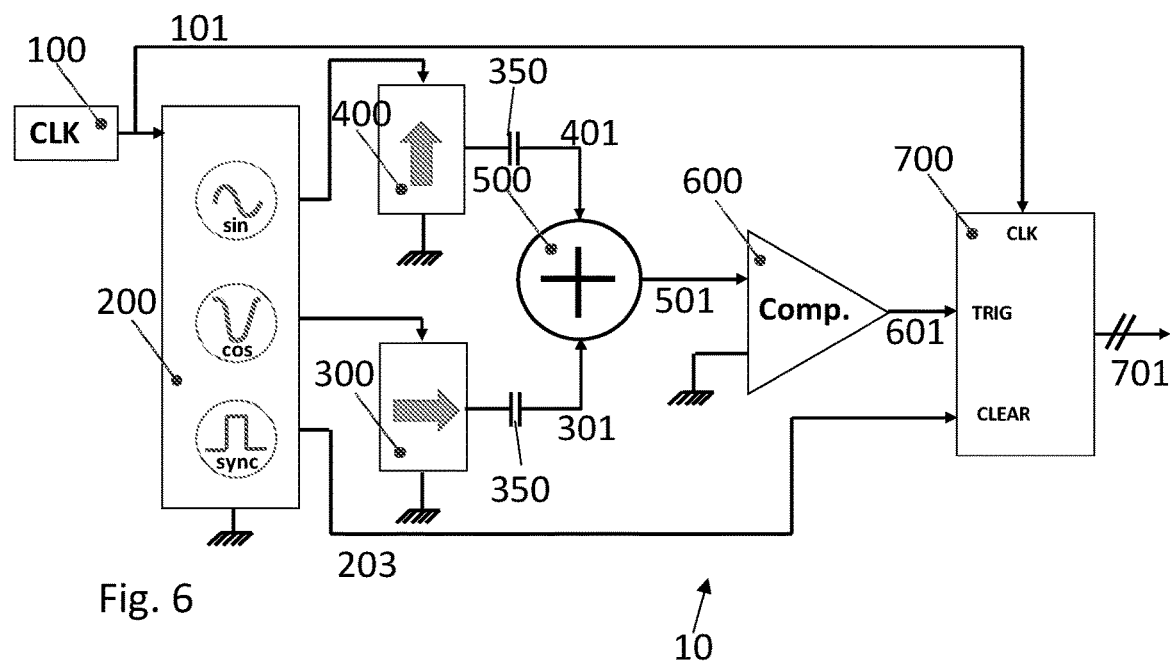

FIG. 6 shows the electronic circuit 10 according to another embodiment. The electronic circuit 10 corresponds to the one of FIG. 5, wherein a DC blocking capacitor 350 is provided at each input of the adder circuit 500, i.e., in the electrical path of the first and second sensing output signals 301, 401. The capacitors 350 increases the angular resolution of the electronic circuit 10, i.e., increases the resolution of the determined angle θ of the external magnetic field 60.

Figure 7:
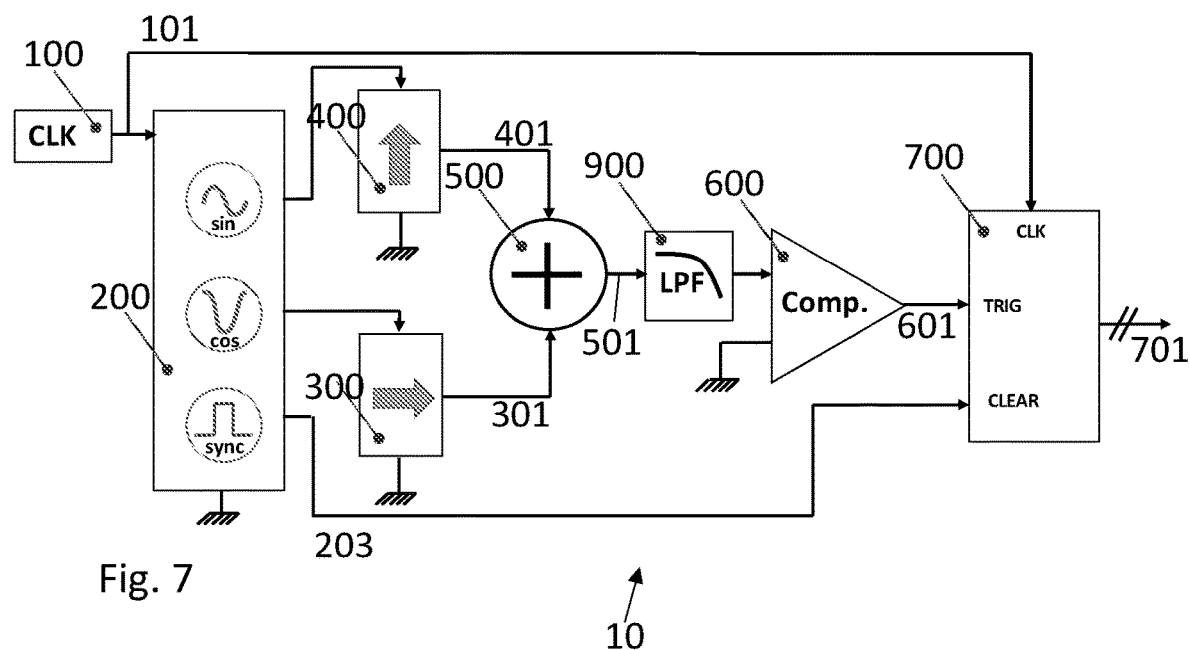

FIG. 7 shows the electronic circuit 10 according to yet another embodiment. The electronic circuit 10 corresponds to the one of FIG. 5, further comprising a low-pass filter 900 placed between the output of the adder circuit 500 and the input of the phase comparator 600. The low-pass filter 900 is configured for suppressing higher order harmonics, except the first harmonic (fundamental frequency) of the summed signal 501. The higher order harmonics can be introduced by the voltage generator 200 and/or by first and second magnetic field sensing units 300, 400. The low-pass filter 900 increases the angular resolution of the electronic circuit 10, i.e., increases the resolution of the determined angle θ of the external magnetic field 60.

Figure 8:
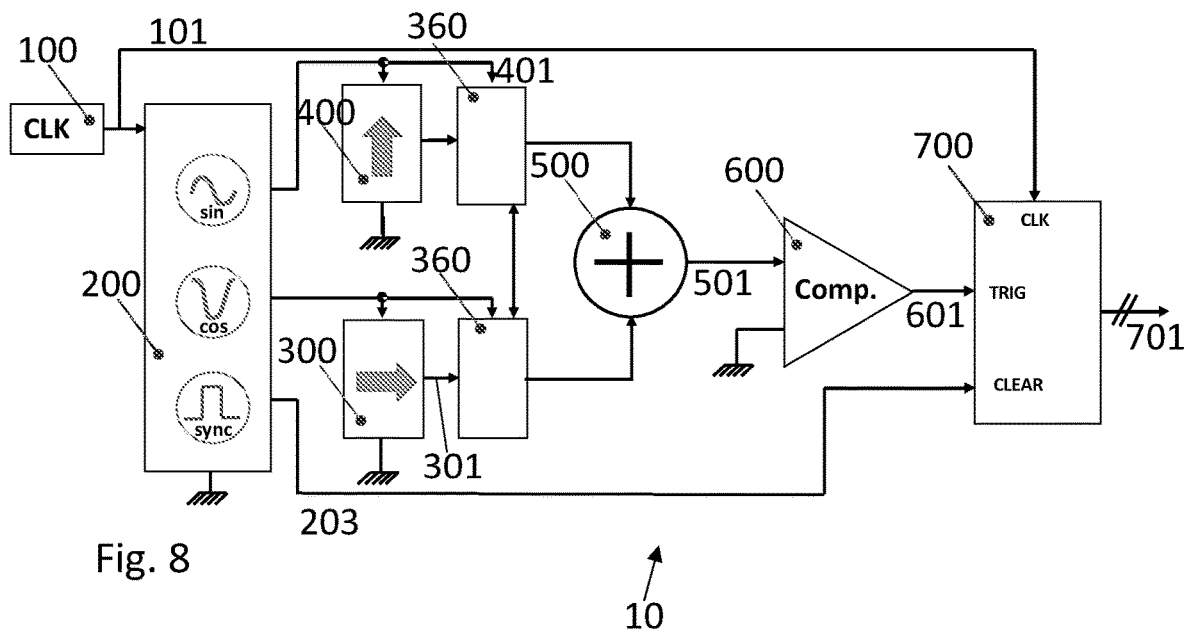

FIG. 8 represents the electronic circuit 10 according to yet another embodiment. The electronic circuit 10 corresponds to the one of FIG. 5, further comprising a sensor correction module 360 connected to the output of the first magnetic field sensing unit 300 and the second magnetic field sensing unit 400. The sensor correction module 360 is configured for alleviating the imperfections of the first and second magnetic field sensing units 300, 400. In particular, the sensor correction module 360 can be used for matching the sensitivity of the first and second magnetic field sensing units 300, 400 by setting the internal gain (or resistive divider ratio).

In practice, a conventional magnetic field sensor has offsets that affect the voltage across the sensor. The presence of the voltage offset in the magnetic field sensing unit 300, 400 reduces the precision with which the logic state of the magnetic field sensing unit is read. The sensor correction module 360 can be used for at least partially eliminating that offset. The sensor correction module 360 can further be used for adding or subtracting part of the signal coming from the voltage generator 200.

The sensor correction module 360 can further be used for reducing departure in the orthogonality between the sensing axis 330 of the first magnetic field sensing unit 300 and the sensing axis 430 of the second magnetic field sensing unit 400. Reducing departure in the orthogonality between the sensing axis 330 and 430 can be further, or alternatively, realized either by programming the reference magnetization 210 of the magnetic field sensing element 20-23, or by resistor trimming, for example using laser trimming.

Figure 9:
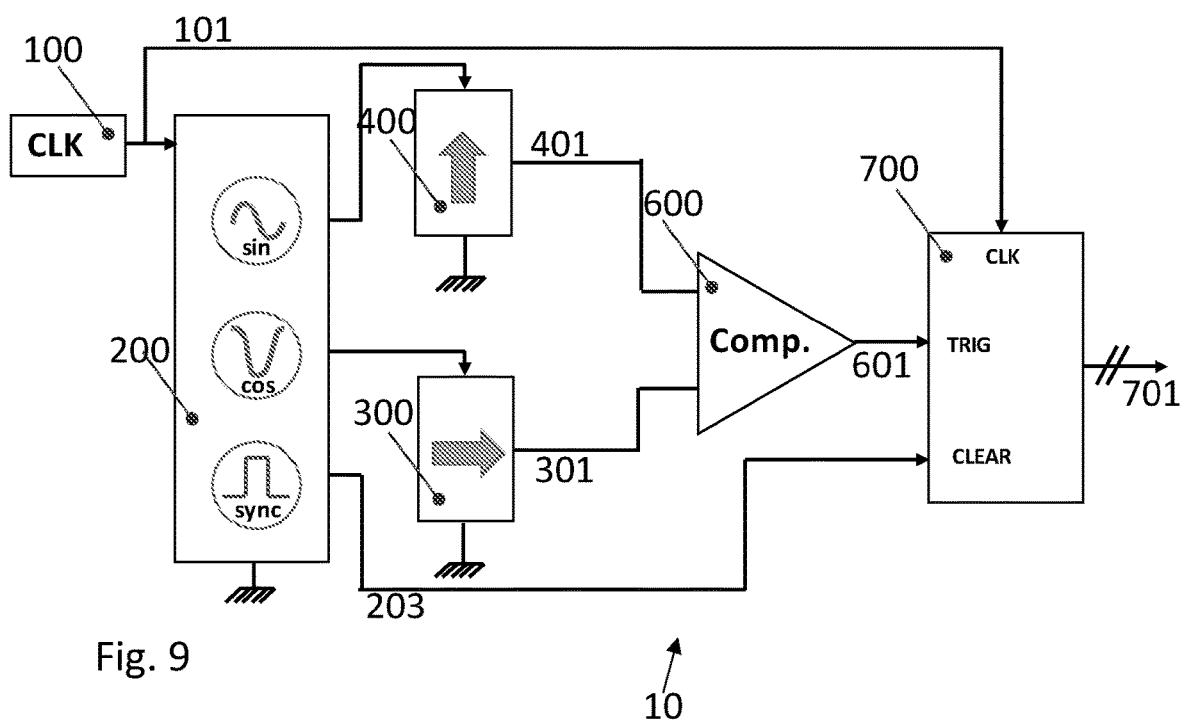

FIG. 9 represents the electronic circuit 10 according to yet another embodiment. The electronic circuit 10 corresponds to the one of FIG. 5, wherein the first sensing output signal 301 from the first magnetic field sensing unit 300 and the second output signal 401 form the second magnetic field sensing unit 400 are inputted directly into the phase comparator 600. The phase comparator 600 provides the functions of summing the first sensing output signal 301 to the second output signal 401 and of detecting the phase of the summed signal. The conditioned signal corresponds to a digital phase comparator signal 601 outputted by the phase comparator 600. The electronic circuit 10 is simpler than the other circuit configurations.

Figure 10:
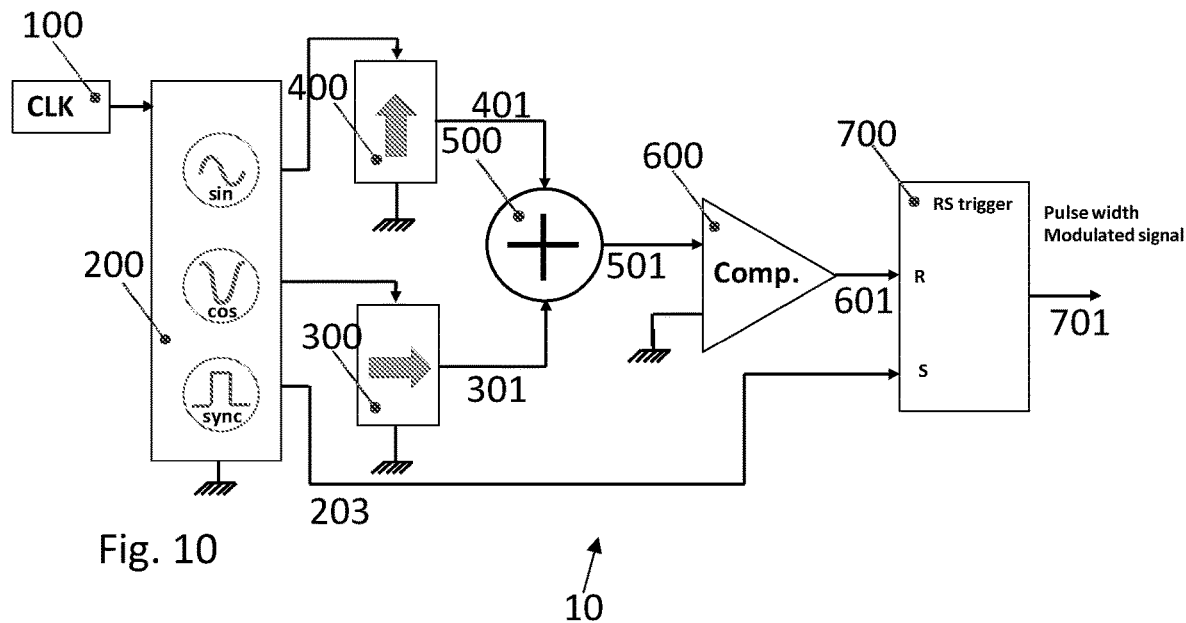

FIG. 10 shows the electronic circuit 10 according to yet another embodiment. The electronic circuit 10 corresponds to the one of FIG. 5, wherein the magnetic field angle detection unit 700 comprises a RS trigger (or RS flip flop) circuit into which the phase comparator signal 601 and the generator synchronization signal 203 are inputted. In this configuration, the information corresponding to the determined angle θ of the external magnetic field 60 is coded in a pulse width modulated signal. The electronic circuit 10 configuration of FIG. 9 can be advantageously used in auto regulating applications.

Figure 11:
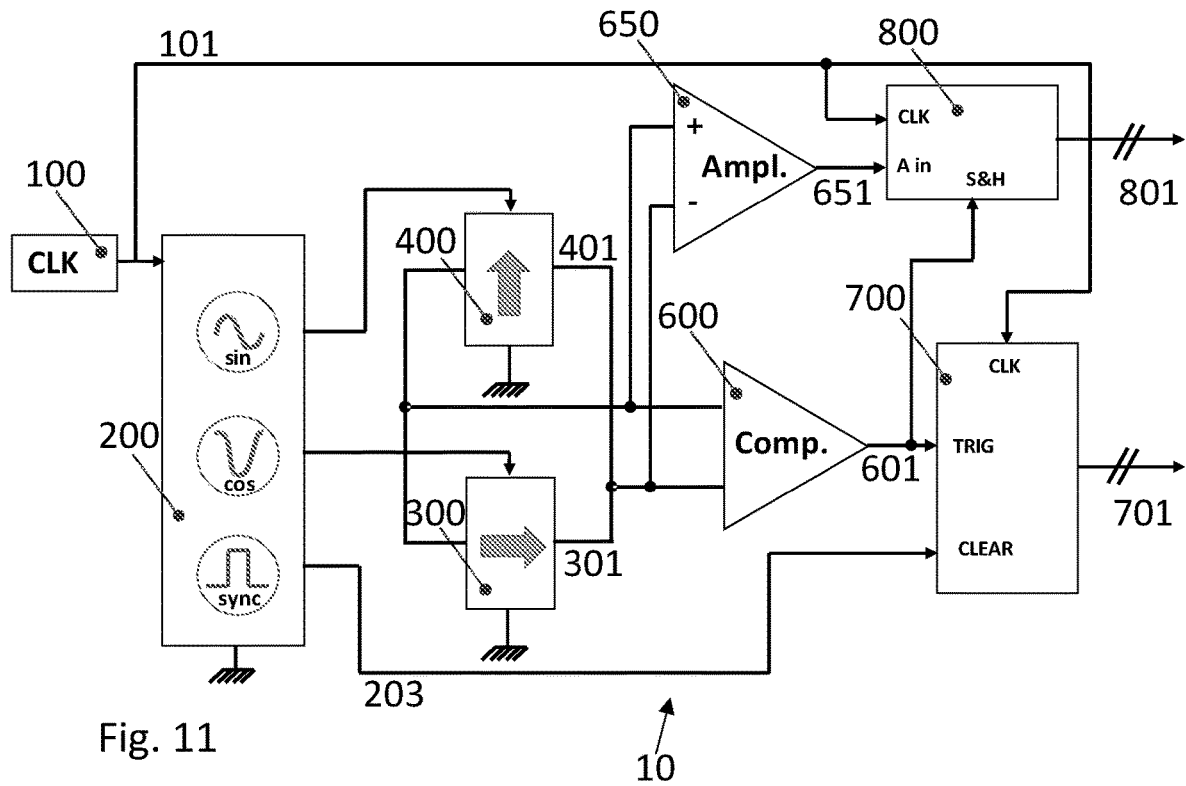

FIG. 11 illustrates the electronic circuit 10 according to yet another embodiment. The electronic circuit 10 corresponds to the one of FIG. 4, wherein the first and second magnetic field sensing units 300, 400 are connected such as to form a differential magnetic field sensor arrangement. In this configuration, summing the first sensing output signal 301 to the second output signal 401 is performed by the direct connection of the first sensing output signal 301 to the second output signal 401. The electronic circuit 10 further comprises a differential amplifier 650 comprising two analog input terminals to which the first and second sensing output signals 301, 401 are connected. The differential amplifier 650 outputs a binary digital differential amplifier output signal 651 that is inputted into the magnetic field intensity detection unit 800 such as to determine the intensity H of the external magnetic field 60 and output the magnetic field intensity 801.

The configuration of the electronic circuit 10 shown in FIG. 11 simpler that the circuit of FIG. 4. This configuration further avoids the use of a single-ended-to-differential transformation circuit.

Figure 12:
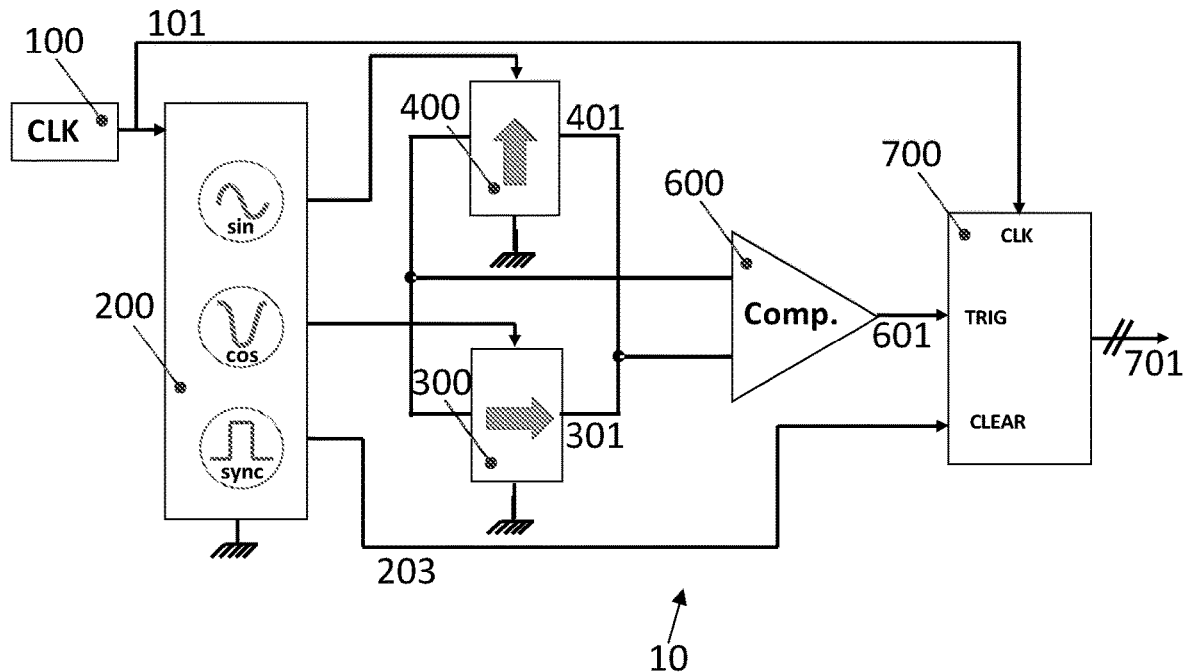

FIG. 12 shows the electronic circuit 10 according to yet another embodiment. The electronic circuit 10 corresponds to a simplified variant of the circuit of FIG. 11, wherein the magnetic field sensing units 300, 400 comprise magnetic field sensing elements having the reference magnetization 210 in the saturated state. In comparison with the configuration of FIG. 11, the electronic circuit 10 does not comprise the differential amplifier 650 and does also not comprise the magnetic field intensity detection unit 800.

Figure 13:
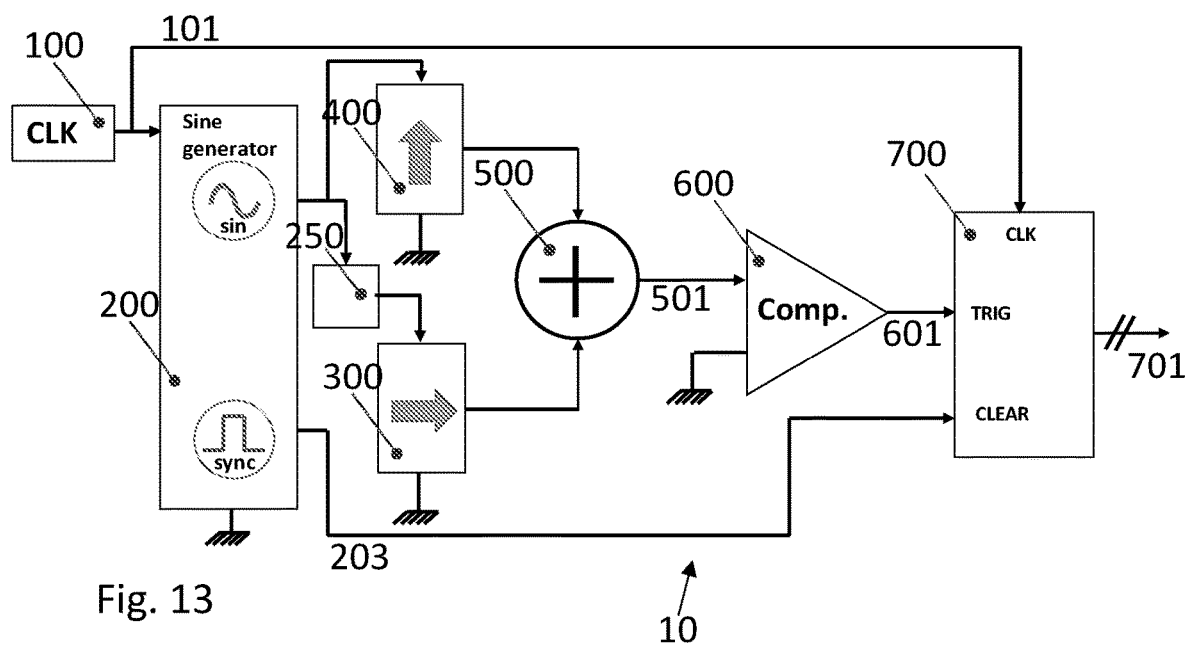

FIG. 13 shows the electronic circuit 10 according to yet another embodiment. The electronic circuit 10 corresponds to a simplified variant of the circuit of FIG. 5, wherein the voltage generator 200 comprises a single output monoharmonic voltage generator. In other words, the voltage generator 200 is configured for supplying the first generator signal 201, for example a sine waveform, and for supplying a generator synchronization signal 203 having the same frequency as the first and a generator second signals 201. The electronic circuit 10 further comprises a phase shifter (or quadrature booster) 250 configured for phase-shifting by 90° the first generator signal 201 and generate the second generator signal 202.

In the case of embodiments shown on FIGS. 2, 4, 5, 6, 7, 8, 9,10 and 13, the first and second magnetic field sensing units 300, 400 form a differential magnetic field sensor arrangement and it is a differential-to-single-ended transformation circuit is included in the electronic circuit 10.

Having described various embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the scope of the following claims.

REFERENCE NUMBERS AND SYMBOLS

10 electronic circuit
20, 21, 22, 23 magnetic field sensing element
60 external magnetic field
100 clock generator
101 clock synchronization signal
130 1D magnetic sensor
131 1D magnetic sensor
132 first output signal
133 second output signal
134 analog-to-digital converter
136, 137 sensing axis
138 digitized signal
139 processing unit
200 periodic voltage generator
201 first voltage waveform
202 second voltage waveform
203 generator synchronization signal
250 phase shifter
300 first magnetic field sensing unit
301 first sensing output signal
330 first sensing axis
350 capacitor
360 sensor correction module
400 second magnetic field sensing unit
401 second sensing output signal
430 second sensing axis
500 signal conditioning unit, adder circuit
501 summed signal
600 phase comparator
601 conditioned signal, phase comparator signal
650 differential amplifier
651 differential amplifier output signal
700 magnetic field angle detection unit
701 digital angle output
800 magnetic field intensity detection unit
801 digital magnetic field intensity output
900 low-pass filter
θ magnetic field angle
$f_g$ fixed frequency, generator frequency
H magnetic field intensity
V voltage

The invention claimed is:
1. An electronic circuit for measuring an angle and an intensity of an external magnetic field, comprising:

a first magnetic field sensing unit being configured to output a first sensing output signal and a second magnetic field sensing unit being configured to output a second sensing output signal, a first sensing axis of the first magnetic field sensing unit being substantially orthogonal to a second sensing axis of the second magnetic field sensing unit;

a voltage generator configured to supply a synchronization signal having a generator frequency and to supply a first voltage waveform to the first magnetic field sensing unit and a second voltage waveform to the second magnetic field sensing unit; wherein the first and second voltage waveforms have substantially the same amplitude and the same generator frequency, and are phase shifted by about 90° with respect to each other;

a signal conditioning unit into which the first and second sensing output signals are inputted and configured to add the first sensing output signal (301) to the second sensing output signal to obtain a summed signal and output a conditioned signal;
and
a magnetic field angle detection unit, which is configured to receive the conditioned signal and the synchronization signal, and is configured to measure a phase shift between the conditioned signal and the synchronization signal and to determine the angle of the external magnetic field from the measured phase shift;

wherein each of the first and second magnetic field sensing units comprises a magnetic tunnel junction and is configured such that an amplitude of the first and second sensing output signals varies linearly with a variation of the intensity of the external magnetic field, the electronic circuit further comprising a magnetic field intensity detection unit configured to determine the intensity of the external magnetic field by sampling the amplitude of the summed signal at its maximum to obtain a corresponding sampled magnetic field intensity output, the occurrence of the maximum being detected base on the conditioned signal being a digital phase comparator signal of the summed signal.

2. The electronic circuit according to claim 1, wherein signal conditioning unit is configured to add the first sensing output signal to the second sensing output signal in the ratio 1:1.

3. The electronic circuit according to claim 1, wherein each of the first and second magnetic field sensing unit comprises a plurality of magnetic field sensing elements arranged in half-bridge or full-bridge circuit acting as a voltage divider, wherein the divider ratio is a function of the angle and field intensity of the external magnetic field.

4. The electronic circuit according to claim 1,
wherein the signal conditioning unit comprises a phase comparator, the phase comparator being configured to detect the phase of the summed signal; and
wherein the outputted conditioned signal comprises a digital phase comparator signal.

5. The electronic circuit according to claim 4, wherein the first and second magnetic field sensing units are connected such as to form a differential magnetic field sensor arrangement.

6. The electronic circuit according to claim 5, further comprising a differential amplifier comprising two analog input terminals to which the first and second sensing output signals are connected; the differential amplifier being configured for outputting a binary digital differential amplifier output signal that is inputted into the magnetic field intensity detection unit such as to determine the intensity of the external magnetic field.

7. The electronic circuit according to claim 1,
wherein the signal conditioning unit comprises an adder circuit into which the first and second sensing output signals are inputted, the adder circuit being configured to add up the first and second sensing output signals and output a corresponding summed signal;
wherein the signal conditioning unit further comprises a phase comparator into which the summed signal is inputted, the phase comparator being configured to detect the phase of the summed signal; and
wherein the conditioned signal corresponds to a digital phase comparator signal outputted by the phase comparator.

8. The electronic circuit according to claim 7, further comprising a DC blocking capacitor between each of the first magnetic field sensing unit and the second magnetic field sensing unit and the input of the adder circuit.

9. The electronic circuit according to claim 7, further comprising a low-pass filter placed between the output of the adder circuit and the input of the phase comparator, said low-pass filter being configured to suppress higher order harmonics, except the first harmonic of the summed signal.

10. The electronic circuit according to claim 7, further comprising a sensor correction module connected to each of the first magnetic field sensing unit and the second magnetic field sensing unit.

11. The electronic circuit according to claim 7, wherein the digital phase comparator signal is inputted in the magnetic field intensity detection unit configured to sample the amplitude of the summed signal at its maximum and to obtain a sampled magnetic field intensity output comprising the information about the external field intensity.

12. The electronic circuit according to claim 11, wherein the magnetic field intensity detection unit is configured to sample the amplitude of the summed signal by synchronizing the summed signal with the phase of the summed signal and a predefined delay which is set by the number of clock pulses of the synchronization signal and which corresponds to 90° phase shift with respect to the phase comparator signal.

13. The electronic circuit according to claim 1, wherein the voltage generator is further configured to supply a generator synchronization signal having the generator frequency for synchronizing the magnetic field angle detection unit.

14. The electronic circuit according to claim 13, wherein the magnetic field angle detection unit comprises a RS trigger into which the phase comparator signal and the generator synchronization signal are inputted, such that the information corresponding to the magnetic field angle is coded in a pulse width modulated signal.

* * * * *

UNITED STATES PATENT AND TRADEMARK OFFICE
CERTIFICATE OF CORRECTION

| | | |
|---|---|---|
| PATENT NO. | : 11,946,985 B2 | |
| APPLICATION NO. | : 17/440908 | |
| DATED | : April 2, 2024 | |
| INVENTOR(S) | : Andrey Timopheev et al. | |

It is certified that error appears in the above-identified patent and that said Letters Patent is hereby corrected as shown below:

In the Specification

Column 6, Line 4, delete "230" and replace with --330--.

Column 9, Line 1, delete "first and a generator second signals 201." and replace with --first generator second signal 201.--.

Signed and Sealed this
Twenty-ninth Day of October, 2024

Katherine Kelly Vidal
*Director of the United States Patent and Trademark Office*